(12) United States Patent
Zan et al.

(10) Patent No.: US 11,966,667 B2
(45) Date of Patent: Apr. 23, 2024

(54) INTELLIGENT SIMULATION SYSTEM FOR JACKET TOWING AND MODELING METHOD THEREOF

(71) Applicant: HARBIN ENGINEERING UNIVERSITY, Harbin (CN)

(72) Inventors: Yingfei Zan, Harbin (CN); Lihao Yuan, Harbin (CN); Duanfeng Han, Harbin (CN); Hui Jia, Harbin (CN)

(73) Assignee: HARBIN ENGINEERING UNIVERSITY, Harbin (CN)

( * ) Notice: Subject to any disclaimer, the term of this patent is extended or adjusted under 35 U.S.C. 154(b) by 0 days.

(21) Appl. No.: 18/144,883

(22) Filed: May 9, 2023

(65) Prior Publication Data
US 2024/0070341 A1 Feb. 29, 2024

Related U.S. Application Data

(63) Continuation of application No. PCT/CN2022/125616, filed on Oct. 17, 2022.

(30) Foreign Application Priority Data

Aug. 26, 2022 (CN) .......................... 202211031686.1

(51) Int. Cl.
| | |
|---|---|
| G06F 30/00 | (2020.01) |
| B63B 35/68 | (2006.01) |
| G06F 30/15 | (2020.01) |

(52) U.S. Cl.
CPC .............. *G06F 30/15* (2020.01); *B63B 35/68* (2013.01)

(58) Field of Classification Search
None
See application file for complete search history.

(56) References Cited

U.S. PATENT DOCUMENTS

| | | | | |
|---|---|---|---|---|
| 4,690,586 A | * | 9/1987 | Oksuzler | E02B 17/027 405/209 |
| 5,097,786 A | * | 3/1992 | Sheffield | E02B 17/027 405/209 |

(Continued)

FOREIGN PATENT DOCUMENTS

| | | |
|---|---|---|
| CN | 105200970 A | 12/2015 |
| CN | 107725000 A | 2/2018 |

(Continued)

OTHER PUBLICATIONS

Zan Yingfei, Concept Design of Lifting Operation Simulation System of a Deepwater Pipe-laying Crane Vessel, Chinese Master's Theses Full-text Database Engineering Science and Technology II, 2012, pp. 1-13, 15-39, 41-78.

(Continued)

*Primary Examiner* — Martin Mushambo
(74) *Attorney, Agent, or Firm* — Bayramoglu Law Offices LLC

(57) ABSTRACT

An intelligent simulation system for jacket towing system includes a distributed collaborative simulation subsystem configured to provide a communication interface for each subsystem, a comprehensive management and evaluation subsystem configured to generate and issue a simulation subject, an operation control simulation subsystem configured to generate operation instructions, a motion simulation subsystem configured to receive parameters of the subject and the operation instructions, simulate a motion state of the jacket, a tugboat and a towrope in real time, and transmit the simulated motion states to the visual simulation subsystem, and a visual simulation subsystem configured to perform a three-dimensional display for the real-time simulation of the motion states of the jacket, the tugboat and the towrope. The intelligent simulation system involves human-computer interaction, which can be used for cooperative training and (Continued)

skill training of offshore towing operators, as well as for simulation rehearsal and scheme verification of jacket towing and installation.

5 Claims, 3 Drawing Sheets

(56) References Cited

U.S. PATENT DOCUMENTS

| | | | | |
|---|---|---|---|---|
| 5,807,029 | A * | 9/1998 | Ellnor | B63B 35/003 |
| | | | | 405/209 |
| 6,354,765 | B2 * | 3/2002 | Jones | E02B 17/00 |
| | | | | 405/209 |
| 7,011,473 | B2 * | 3/2006 | Tangen | B63B 35/003 |
| | | | | 405/209 |

FOREIGN PATENT DOCUMENTS

| | | |
|---|---|---|
| CN | 112900402 A | 6/2021 |
| CN | 113741213 A | 12/2021 |
| CN | 114755935 A | 7/2022 |
| WO | 2022205748 A1 | 10/2022 |

OTHER PUBLICATIONS

Wu Cheng-Cheng, et al., 6-DOF maneuvering simulation of ship towing system, Ship Science and Technology, 2016, pp. 57-62, vol. 38, No. 6.

Zan Yingfei, et al., Design and Practice of Virtual Simulation Experiment for Offshore Platform Installation Based on Rule and Interaction, Chinese Modern Education Equipment, 2022, pp. 23-25, Issue 383.

Yingfei Zan, et al., Experimental study of a suspended subsea module at different positions in the splash zone, Marine Structures, 2021, pp. 1-20, vol. 77, 102935.

* cited by examiner

INTELLIGENT SIMULATION SYSTEM FOR JACKET TOWING AND MODELING METHOD THEREOF

CROSS REFERENCE TO THE RELATED APPLICATIONS

This application is the continuation application of International Application No. PCT/CN2022/125616, filed on Oct. 17, 2022, which is based upon and claims priority to Chinese Patent Application No. 202211031686.1, filed on Aug. 26, 2022, the entire contents of which are incorporated herein by reference.

TECHNICAL FIELD

The present disclosure relates to a technical field of marine engineering and virtual simulation technology, in particular to an intelligent simulation system for jacket towing and a modeling method thereof.

BACKGROUND

As one of the typical offshore platforms, jacket has characteristics of high construction cost, high towing difficulty and high transportation risk, and is widely used in oil development in waters near continental shelf. Generally, the jacket is constructed at a land terminal, and then transported to a target oil field. Wet towing refers to a transportation method that after the jacket enters the water, the jacket is in a floating state by providing buoyancy modules or binding buoys and is directly towed by tugs. The wet towing happens between launching and righting, mainly used for short-distance transportation and installation in place, and has characteristics of high risk but strong economy. Factors that cannot be ignored in offshore installation operation are complex and changeable natural environments. The wet towing process for the jacket is also inevitably affected by changes of tidal current and wind direction. How to overcome impacts of meteorological changes and ensure safety and reliability of the wet towing are the biggest problems faced by the wet towing for the jacket. Therefore, it is of great significance to simulate and rehearse the marine wet towing transportation plan before an actual offshore construction operation, predict and avoid risks of offshore operation in advance, and verify feasibility of the transportation plan to ensure the safety of the offshore construction operation and improve the construction efficiency.

Therefore, how to provide an intelligent simulation system for jacket towing and modeling method thereof that can simulate and rehearse the marine wet towing transportation plan before the actual offshore construction operation, predict and avoid the risks of the offshore operation in advance, verify the feasibility of the transportation plan, ensure the safety of the offshore construction operation and improve the construction efficiency is an urgent problem for those skilled in the field.

SUMMARY

In view of this, the present disclosure provides an intelligent simulation system for jacket towing and a modeling method thereof. By adopting a distributed simulation architecture based on High Level Architecture (HLA), the intelligent simulation system for jacket towing is divided into five subsystems, namely distributed collaborative simulation subsystem, comprehensive management and evaluation subsystem, operation control simulation subsystem, visual simulation subsystem and motion simulation subsystem. The distributed collaborative simulation subsystem is configured to provide a communication interface for various federal members. A comprehensive management and control subsystem is configured to issue a training subject and control start-stop of a simulation process. The motion simulation subsystem is configured to receive information, such as an initial state of the jacket, an initial state of a tugboat and property parameters of a towrope sent by an instructor through network, and receive control instructions from a winch console and a tugboat console. The motion simulation subsystem is further configured to simulate motion states of the jacket, the tugboat and the towrope in real time, and send simulation data to the visual simulation subsystem and the comprehensive management and evaluation subsystem for scene roaming and data analysis. Based on an established six-degree-of-freedom motion simulation model, real-time motion states of the jacket, the tugboat and the towrope can be accurately simulated considering dynamic sea conditions during a towing process. Combined with the visual simulation subsystem, collision interferences and operation risk points in the towing process of the jacket can be visually fed back. The present disclosure involves human-computer interaction, which can be used for cooperative training and skill training of offshore towing operators, as well as for simulation rehearsal and scheme verification of jacket towing and installation. The present disclosure can effectively guarantee safety of operators and equipment, reduce risk of offshore operation, improve operation efficiency, and has obvious economic and social benefits.

In order to achieve the above effects, the present disclosure adopts the following solutions:

An intelligent simulation system for jacket towing, includes: a distributed collaborative simulation subsystem, a comprehensive management and evaluation subsystem, an operation control simulation subsystem, a visual simulation subsystem and a motion simulation subsystem.

The distributed collaborative simulation subsystem is configured to provide a communication interface for each subsystem.

The comprehensive management and evaluation subsystem is configured to generate and issue a simulation subject.

The operation control simulation subsystem is configured to generate operation instructions.

The motion simulation subsystem is configured to receive parameters of the simulation subject and the operation instructions, simulate a motion state of the jacket, a motion state of a tugboat and a motion state of a towrope in real time, and transmit the simulated motion states to the visual simulation subsystem.

The visual simulation subsystem is configured to perform a three-dimensional display for the real-time simulation of the motion state of the jacket, the motion state of the tugboat and the motion state of the towrope.

In an embodiment, the distributed collaborative simulation subsystem adopts a distributed simulation architecture based on High Level Architecture (HLA), and the distributed collaborative simulation subsystem is configured to communicate with each federal member by utilizing a Real Time Interface (RTI) and monitor operation status of each federal member through a federal operation monitoring module.

In an embodiment, the comprehensive management and evaluation subsystem includes an instructor console and has a function of comprehensive management and evaluation, and the comprehensive management and evaluation subsystem is configured to set marine environment parameters, an initial position of the jacket, an initial position of the tugboat, and physical property parameters of the towrope, generate and issue a simulation training subject, control start-stop of a simulation process of the system, and record and visually display simulation data generated by the motion simulation subsystem.

In an embodiment, the operation control simulation subsystem includes a tugboat console and a winch console, the tugboat console is configured to set basic operation parameters of tugboat course and navigation speed, and the winch console is configured to set retraction and release speed of the towrope.

In an embodiment, the motion simulation subsystem includes a six-degree-of-freedom motion simulation model of the jacket, a six-degree-of-freedom motion simulation model of the tugboat and a motion simulation model of the towrope; the motion simulation subsystem is configured to calculate six-degree-of-freedom motion data of the jacket, six-degree-of-freedom motion data of the tugboat and shape and tension of the towrope in real time by receiving the marine environment parameters of current velocity, current direction and wave direction, the initial position of the tugboat, the initial position of the jacket, and initial parameters of diameter, dry weight and wet weight of the towrope generated by the comprehensive management and evaluation subsystem, and the operation instructions of target course, navigation speed and winch speed generated by the operation control simulation subsystem; and the motion simulation subsystem is further configured to provide the simulation data to the visual simulation subsystem and the comprehensive management and evaluation subsystem.

In an embodiment, the visual simulation subsystem comprises a three-dimensional model library for towing operation of the jacket and a visual simulation software; the visual simulation subsystem is configured to drive three-dimensional scene through model simulation data and render the motion state of the jacket, the motion state of the tugboat, the shape of the towrope and the marine environment in real time.

The present disclosure further provides an intelligent simulation method for jacket towing, including:

step (1): starting a distributed collaborative simulation subsystem to enable software and hardware communications of each subsystem and monitor operation status of each federal member;

step (2): applying a comprehensive management and evaluation subsystem to select a simulation training subject, set sea conditions, an initial position of the jacket, an initial position of a tugboat and initial parameters of a towrope, send the set parameters to a motion simulation subsystem and control start-stop of a simulation process of the system through network;

step (3): applying an operation control simulation subsystem to set winch speed and tugboat control instructions through an operation handle and a control software according to simulation requirements, and send the winch speed and the tugboat control instructions to the motion simulation subsystem;

step (4): applying the motion simulation subsystem including a six-degree-of-freedom motion simulation model of the jacket, a six-degree-of-freedom motion simulation model of the tugboat and a motion simulation model of the towrope, to drive the six-degree-of-freedom motion simulation model based on the control instructions sent by the comprehensive management and evaluation subsystem and the operation control simulation subsystem, calculate a motion state of a coupling system in real time, and transmit simulation data to the comprehensive management and evaluation subsystem and a visual simulation subsystem; and step (5): applying the visual simulation subsystem to render training scene and operation equipment in real time and display the three-dimensional training scene and the operation equipment, based on marine environment data issued by the comprehensive management and evaluation subsystem and the simulation data calculated by the motion simulation subsystem.

In an embodiment, in step (4), force of the towrope on the jacket and force of the towrope on the tugboat are respectively introduced into motion equations of the jacket and the tugboat; an end of the towrope is regarded as fixed to the jacket, and a top of the towrope is regarded as fixed to the tugboat; node speeds and spatial positions of the end of the towrope and the top of the towrope are respectively kept consistent with node speeds and spatial positions of the jacket and the tugboat in a solving process; and the jacket, the tugboat and the towrope are regarded as a whole for coupling solution.

Both the six-degree-of-freedom motion simulation model of the jacket and the six-degree-of-freedom motion simulation model of the tugboat take marine environmental loads and tension force generated by the motion simulation model of the towrope into consideration.

In an embodiment, in step (4), the motion simulation model of the towrope calculates based on initial parameters of the towrope set by the comprehensive management and evaluation subsystem.

In an embodiment, in step (4), the six-degree-of-freedom motion simulation model of the jacket is:

$$\vec{F} = \vec{F}_I + \vec{F}_D + \vec{F}_B + \vec{F}_{AM\_M},$$

where $\vec{F}_I$ is inertia force, $\vec{F}_D$ is drag force, $\vec{F}_B$ is buoyancy, and $\vec{F}_{AM\_M}$ is added mass force.

The six-degree-of-freedom motion simulation model of the tugboat is:

$$M_s \dot{v}_s + C_s(v_s)v_s + D_s(v_s)v_s + g_s(\eta_s) = \tau_{es},$$

where $M_s$ is an inertia matrix of a tugboat system, comprising a ship mass matrix and an added mass matrix, $D_s(v_s)$ is a damping matrix of the tugboat, $g_s(\eta_s)$ is a vector of force and moment caused by gravity and buoyancy, $C_s(v_s)$ is a Coriolis force matrix, and $\tau_{es}$ is thrust on the tugboat.

the motion simulation model of the towrope is:

$$\underbrace{[m_i + a_i]}_{mass+addedmass} \ddot{r}_i = \underbrace{T_{i+(1/2)} - T_{i-(1/2)} + C_{i+(1/2)} - C_{i-(1/2)}}_{internal-stiffness-and-damping} + \underbrace{W_i + B_i}_{weight-and-contact} + \underbrace{D_{p_i} + D_{q_i}}_{drag};$$

where $m_i$ is a mass matrix of node i, $a_i$ is an added mass matrix of the node i, T is tension at a node, C is internal damping force of the node, $W_i$ is net buoyancy per unit length, $D_{p_i}$ is lateral damping force at the node, and $D_{q_i}$ is tangential damping force at the node.

It can be seen from the above technical solutions that compared with the conventional art, the present disclosure provides an intelligent simulation system for jacket towing and a modeling method thereof. By adopting a distributed simulation architecture based on High Level Architecture (HLA), the intelligent simulation system for jacket towing is divided into five subsystems, namely distributed collaborative simulation subsystem, comprehensive management and evaluation subsystem, operation control simulation subsystem, visual simulation subsystem and motion simulation subsystem. The distributed collaborative simulation subsystem is configured to provide a communication interface for various federal members. A comprehensive management and control subsystem is configured to issue a training subject and control start-stop of a simulation process. The motion simulation subsystem is configured to receive information, such as the initial state of the jacket, the initial state of the tugboat and property parameters of the towrope sent by the instructor through network, and receive control instructions from the winch console and tugboat console. The motion simulation subsystem is further configured to simulate motion states of the jacket, the tugboat and the towrope in real time, and send simulation data to the visual simulation subsystem and the comprehensive management and evaluation subsystem for scene roaming and data analysis. Based on the established six-degree-of-freedom motion model, real-time motion states of the jacket, the tugboat and the towrope can be accurately simulated considering dynamic sea conditions during a towing process. Combined with the visual simulation subsystem, collision interferences and operation risk points in the towing process of the jacket can be visually fed back. The present disclosure involves human-computer interaction, which can be used for cooperative training and skill training of offshore towing operators, as well as for simulation rehearsal and scheme verification of jacket towing and installation. The present disclosure can effectively guarantee safety of operators and equipment, reduce risk of offshore operation, improve operation efficiency, and has obvious economic and social benefits.

BRIEF DESCRIPTION OF THE DRAWINGS

In order to more clearly illustrate technical solutions in the embodiments of the present disclosure or in the conventional art, the accompanying drawings used in the embodiments or the conventional art will now be described briefly. It is obvious that the drawings in the following description are only some embodiments of the disclosure, and that those skilled in the art can obtain other drawings from these drawings without any creative efforts.

DETAILED DESCRIPTION OF THE EMBODIMENTS

In the following, the technical solutions in the embodiments of the present disclosure will be clearly and completely described with reference to the drawings in the embodiments of the present disclosure. Obviously, the described embodiments are only a part of the embodiments of the present disclosure, but not all the embodiments thereof. Based on the embodiments of the present disclosure, all other embodiments obtained by those skilled in the art without any creative efforts shall fall within the scope of the present disclosure.

Example 1

Figure 1:
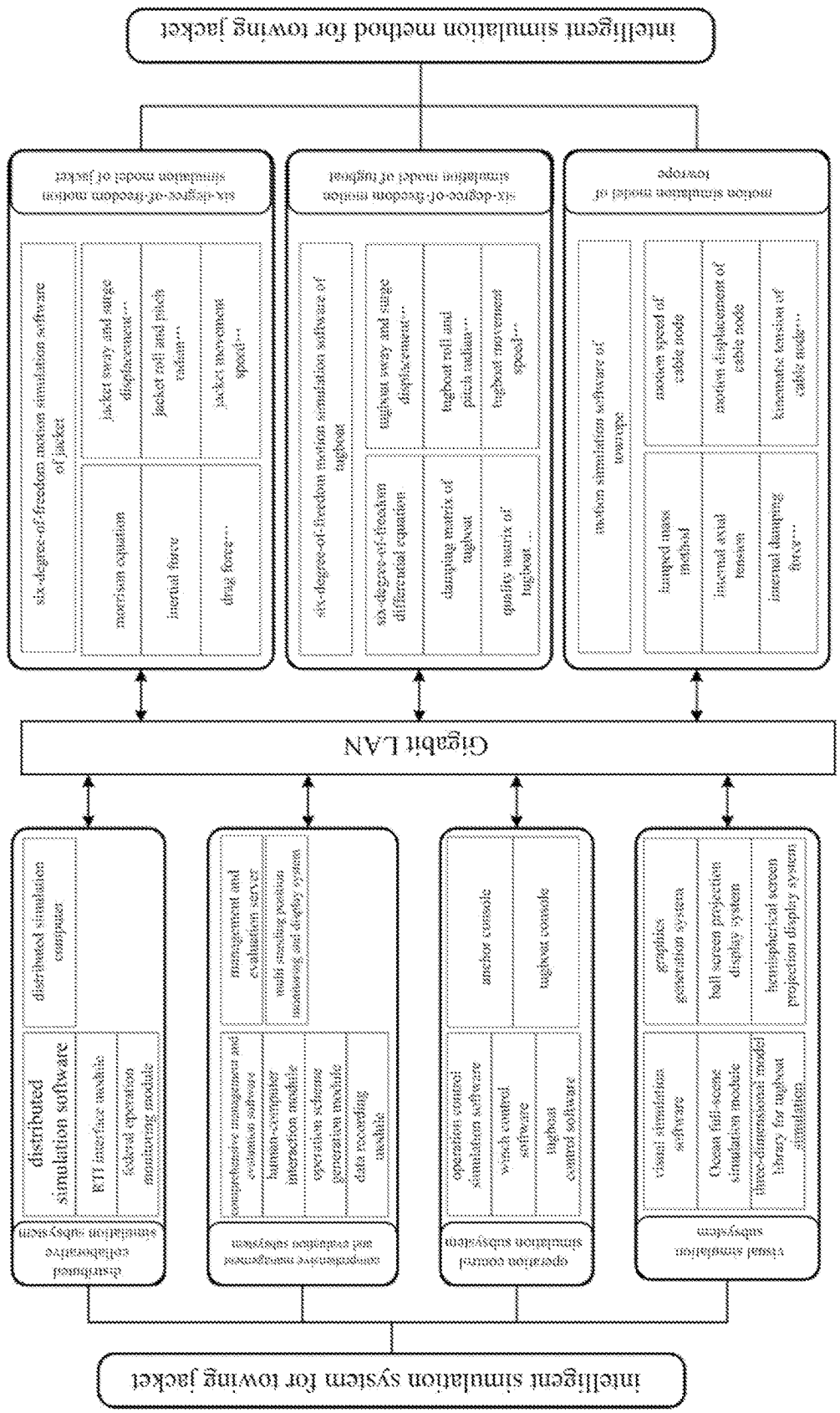
FIG. 1 is a schematic structure diagram of an intelligent simulation system for jacket towing of the present disclosure.

An intelligent simulation system for jacket towing is disclosed in the Example 1 of the present disclosure, as shown in FIG. 1, which includes a distributed collaborative simulation subsystem, a comprehensive management and evaluation subsystem, an operation control simulation subsystem, a visual simulation subsystem and a motion simulation subsystem.

The distributed collaborative simulation subsystem is configured to provide a communication interface for each subsystem. Specifically, the distributed collaborative simulation subsystem adopts a distributed simulation architecture based on High Level Architecture (HLA), and the distributed collaborative simulation subsystem is configured to communicate with each federal member by utilizing a Real Time Interface (RTI) and monitor operation status of each federal member through a federal operation monitoring module.

The comprehensive management and evaluation subsystem is configured to generate and issue a simulation subject. The comprehensive management and evaluation subsystem includes an instructor console and has a function of comprehensive management and evaluation, and the comprehensive management and evaluation subsystem is configured to set marine environment parameters, an initial position of the jacket, an initial position of the tugboat, and physical property parameters of the towrope, generate and issue a simulation training subject, control start-stop of a simulation process of the system, and record and visually display simulation data generated by the motion simulation subsystem.

The operation control simulation subsystem is configured to generate operation instructions. The operation control simulation subsystem comprises a tugboat console and a winch console, the tugboat console is configured to set basic operation parameters of tugboat course and navigation speed, and the winch console is configured to set retraction and release speed of the towrope.

The motion simulation subsystem is configured to receive parameters of the simulation subject and the operation instructions, simulate a motion state of the jacket, a motion state of the tugboat and a motion state of the towrope in real time, and transmit the simulated motion states to the visual simulation subsystem and the comprehensive management and evaluation subsystem. The motion simulation subsystem includes a six-degree-of-freedom motion simulation model of the jacket, a six-degree-of-freedom motion simulation model of the tugboat and a motion simulation model of the towrope. The motion simulation subsystem is configured to calculate six-degree-of-freedom motion data of the jacket, six-degree-of-freedom motion data of the tugboat and shape and tension of the towrope in real time by receiving the marine environment parameters of current velocity, current direction and wave direction, the initial position of the tugboat, the initial position of the jacket, and initial parameters of diameter, dry weight and wet weight of the towrope generated by the comprehensive management and evaluation subsystem, and the operation instructions of target course, navigation speed and winch speed generated by the operation control simulation subsystem; and the motion simulation subsystem is further configured to provide the simulation data to the visual simulation subsystem and the comprehensive management and evaluation subsystem.

The visual simulation subsystem is configured to perform a three-dimensional display for the real-time simulation of the motion state of the jacket, the motion state of the tugboat and the motion state of the towrope. The visual simulation subsystem comprises a three-dimensional model library for towing operation of the jacket and a visual simulation software.

Example 2

An intelligent simulation method for jacket towing is provided in the Example 2 of the present disclosure, which includes step (1) to step (5).

In step (1), a distributed collaborative simulation subsystem is started to enable software and hardware communications of each subsystem and monitor operation status of each federal member.

In step (2), a comprehensive management and evaluation subsystem is applied to select a simulation training subject, set sea conditions including significant wave height, current direction and current velocity, set an initial position of the jacket, an initial position of a tugboat and initial parameters of a towrope including length, diameter, dry weight, wet weight, and stiffness, send the set parameters to a motion simulation subsystem and control start-stop of a simulation process of the system through network.

In step (3), an operation control simulation subsystem is applied by participants to set winch speed and tugboat control instructions including rudder angle, propeller efficiency, target course and target navigation speed through an operation handle and a control software according to simulation requirements, and send the winch speed and the tugboat control instructions to a motion simulation model of the towrope and a six-degree-of-freedom motion simulation model of the tugboat.

Figure 2:
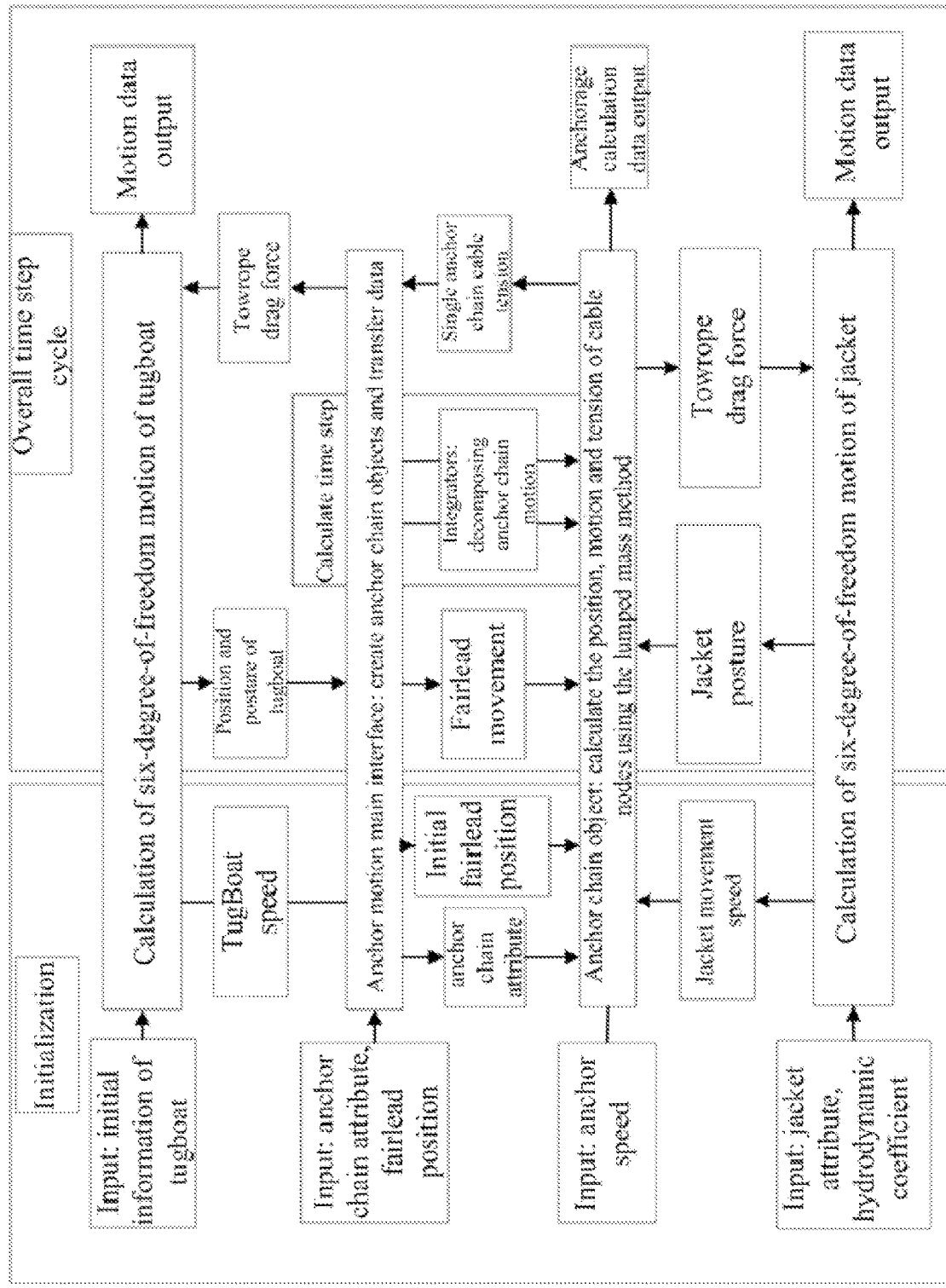
FIG. 2 is a solution flow diagram of a simulation model for jacket towing of the present disclosure.

In step (4), as shown in FIG. 2, the motion simulation subsystem comprising a six-degree-of-freedom motion simulation model of the jacket, the six-degree-of-freedom motion simulation model of the tugboat and the motion simulation model of the towrope is applied to drive the six-degree-of-freedom motion simulation model based on the control instructions sent by the instructor console, winch console, and tugboat console, calculate a motion state of a coupling system in real time, and transmit simulation data to the comprehensive management and evaluation subsystem and a visual simulation subsystem.

The six-degree-of-freedom motion simulation model of the jacket is based on Morison equation, taking into account ocean current force, sea wind force, inertial force, buoyancy, drag force, added mass force, etc. The six-degree-of-freedom motion simulation model of the tugboat is based on six-degree-of-freedom differential equation, taking into account the inertia matrix, damping matrix and Coriolis force matrix, etc. of the tugboat. The motion simulation model of the towrope is based on a lumped mass method to discretize the towrope in space. The entire towrope is divided into N segments by N+1 nodes. The end of the towrope is the $0^{th}$ node, which is connected to the jacket. The top of the towrope is the $(N+1)^{th}$ node, which is connected to the tugboat. The coordinates and tension of each node are calculated separately.

The force of the towrope on the jacket and the force of the towrope on the tugboat are respectively introduced into motion equations of the jacket and the tugboat. The end of the towrope is regarded as fixed to the jacket, and the top of the towrope is regarded as fixed to the tugboat. Node speeds and spatial positions of the end of the towrope and the top of the towrope are respectively kept consistent with node speeds and spatial positions of the jacket and the tugboat in a solving process. The jacket, the tugboat and the towrope are regarded as a whole for coupling solution.

Both the six-degree-of-freedom motion simulation model of the jacket and the six-degree-of-freedom motion simulation model of the tugboat take marine environmental loads and tension force generated by the motion simulation model of the towrope into consideration.

The motion model of the towrope is calculated based on basic parameters set by the instructor console, such as diameter, dry weight, wet weight, length and axial stiffness of the towrope.

The hydrodynamic model of the jacket considers the forces on the jacket in waves during wet towing based on Morison equation. The six-degree-of-freedom motion simulation model of the jacket is:

$$\vec{F} = \vec{F}_I + \vec{F}_D + \vec{F}_B + \vec{F}_{AM\_M};$$

where $\vec{F}_I$ is inertia force, $\vec{F}_D$ is drag force, $\vec{F}_B$ is buoyancy, and $\vec{F}_{AM\_M}$ is added mass force.

The inertial force in the Morison equation is related to acceleration, including two parts. The first part is related to pressure of fluid, and the second part is related to interaction between the structure and the fluid.

$$\vec{F_I} = \begin{Bmatrix} (C_P + C_A)\rho_W \pi (R + t_{MG})^2 (\vec{a}_f - (\vec{a}_f \cdot \hat{k})\hat{k}) + \\ \left\{ C_{P_{AX}} 2\pi (R + t_{MG}) \left| \frac{\partial R}{\partial Z} \right| (\vec{a}_f \cdot \hat{k}) \right\} \hat{k} \\ 0 \\ 0 \\ 0 \end{Bmatrix};$$

$$\frac{\partial R}{\partial z} = \frac{(R^e + t^e_{mg}) - (R^s + t^s_{mg})}{(Z^e - Z^s)};$$

The drag force in the Morison equation is mainly viscous resistance, which is proportional to the square of the relative velocity of the fluid passing through the structural components:

$$\vec{F_D} = \begin{Bmatrix} C_D \rho_W (R + t_{MG}) \| \vec{v}_{rel} - (\vec{v}_{rel} \cdot \hat{k})\hat{k} \|_2 (\vec{v}_{rel} - (\vec{v}_{rel} \cdot \hat{k})\hat{k}) \\ 0 \\ 0 \\ 0 \end{Bmatrix};$$

The buoyancy in the Morison equation is calculated by the displacement:

$$\vec{F_B} = \rho_W g = \begin{Bmatrix} C \begin{Bmatrix} C_{31}\pi(R + t_{MG})^2 \\ C_{32}\pi(R + t_{MG})^2 \\ -2\pi(R + t_{MG})\frac{\partial R}{\partial z} Z \end{Bmatrix} \\ C \begin{Bmatrix} -C_{32}\pi \frac{\partial R}{\partial z}(R + t_{MG})^3 \\ +C_{31}\pi \frac{\partial R}{\partial z}(R + t_{MG})^3 \\ 0 \end{Bmatrix} \end{Bmatrix};$$

The added mass force in the Morison equation generated by structural components in water is calculated as follows:

$$AM_M = \rho_W \pi (R + t_{MG})^2 \left[ \begin{array}{cc} \left[ C_A \left(1 - \hat{k}\hat{k}^T\right) - 2C_{A_{Ax}} \left|\frac{\partial R}{\partial z}\right| \hat{k}\hat{k}^T \right] & [0] \\ [0] & [0] \end{array} \right];$$

$$\vec{F}_{AM\_M} = -AM_M \left\{ \begin{array}{c} \vec{a}_s \\ \vec{a}_s \end{array} \right\} \circ$$

Dynamics of the tugboat can be described by six-degree-of-freedom differential equation. The six-degree-of-freedom motion simulation model of the tugboat is:

$$M_s \dot{v}_s + C_s(v_s)v_s + D_s(v_s)v_s + g_s(\eta_s) = \tau_{es};$$

where $M_s$ is the inertia matrix of a tugboat system, comprising a ship mass matrix and an added mass matrix, $D_s(v_s)$ is the damping matrix of the tugboat, $g_s(\eta_s)$ is a vector of force and moment caused by gravity and buoyancy, $C_s(v_s)$ is the Coriolis force matrix, and $\tau_{es}$ is thrust on the tugboat.

The lumped mass method is adopted for the towrope as the basic dynamic model. The calculation model of the lumped mass method combines internal axial tension, damping force, gravity, buoyancy, and hydrodynamic force calculated by the Morison equation. The force on the towrope per unit length is calculated as follows:

$$F_{MD}^C = \frac{\pi D^2}{4} C_M \rho \dot{u} - \frac{\pi D^2}{4} C_A \rho \ddot{x} + \frac{1}{2} \rho C_D D(u - \dot{x})|(u - \dot{x})|;$$

Where the first term is Krylov Froude force, the second term is the added mass force, and the third term is the drag force. D is section diameter of the towrope, ρ is fluid density, CM=1+CA is inertia force coefficient, CA is added mass coefficient, CD is drag force coefficient, u and u are velocity and acceleration of fluid particle respectively; and ẍ is velocity of the floating body.

The motion simulation model of the towrope, i.e. the complete calculation formula of motion of each node is:

$$\underbrace{[m_i + a_i]}_{mass+addedmass} \ddot{r}_i =$$

$$\underbrace{T_{i+(1/2)} - T_{i-(1/2)} + C_{i+(1/2)} - C_{i-(1/2)}}_{internal-stiffness-and-damping} + \underbrace{W_i + B_i}_{weight-and-contact} + \underbrace{D_{p_i} + D_{q_i}}_{drag};$$

where $m_i$ is a mass matrix of node i, $a_i$ is the added mass matrix of the node i, T is tension at the node, C is internal damping force of the node, $W_i$ is net buoyancy per unit length, $D_{p_i}$ is lateral damping force at the node, and $D_{q_i}$ is tangential damping force at the node.

The second order ordinary differential equation in the above formula may be transformed into the first order ordinary differential equation. The integral calculation is carried out by the second order Runge-Kutta method with continuous time steps.

Figure 3:
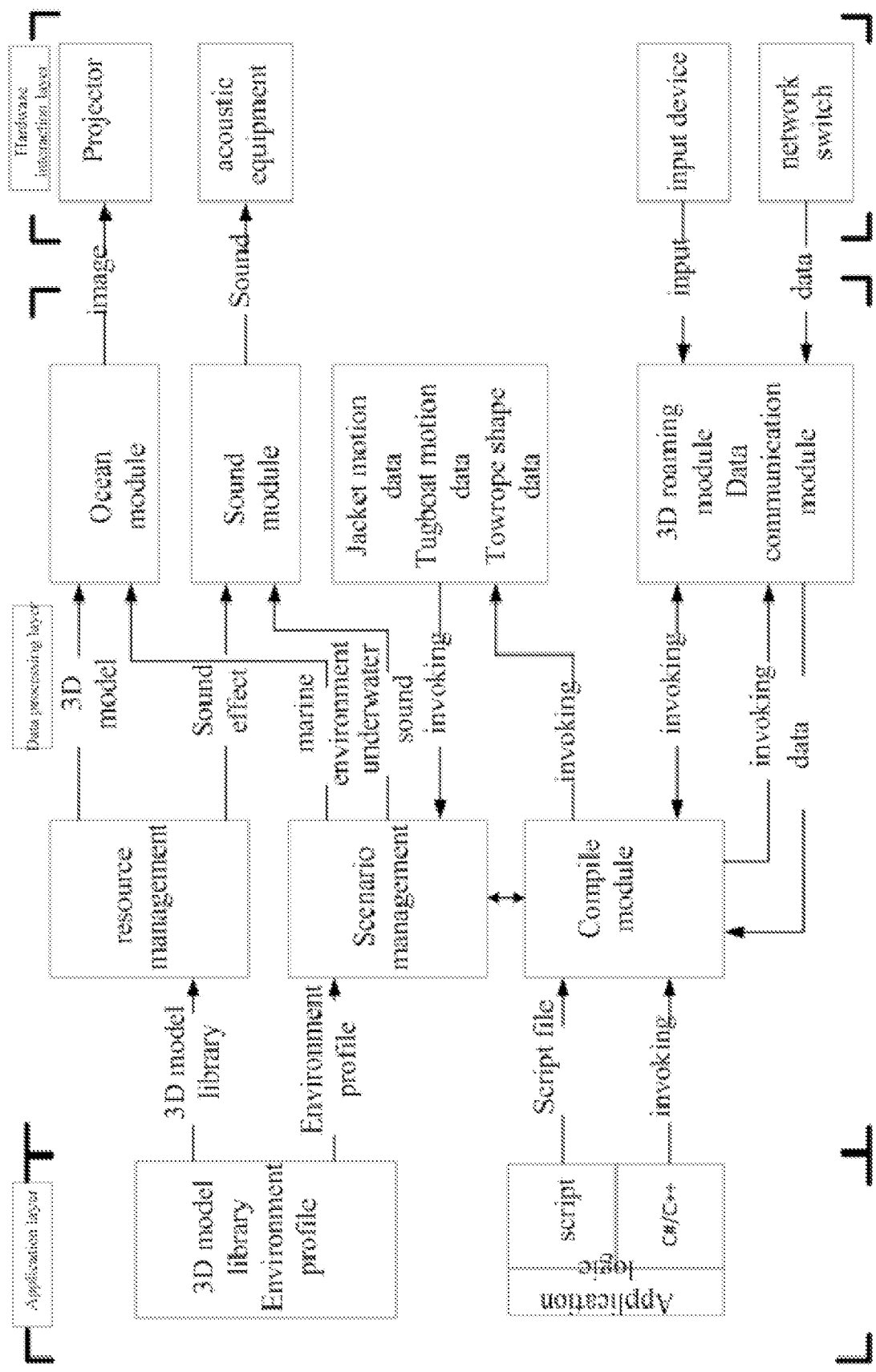
FIG. 3 is a schematic diagram of a design flow of a visual simulation software of the present disclosure.

In step (5), as shown in FIG. 3, the three-dimensional scene simulation is driven based on the marine environment data issued by the comprehensive management and evaluation subsystem and the six-degree-of-freedom motion data of the jacket, the six-degree-of-freedom motion data of the tugboat and the node coordinates of the towrope calculated by the motion simulation subsystem. The three-dimensional training scene and operation equipment are rendered in real time and displayed.

Example 3

Embodiment 3 of the present disclosure includes the following stages:

Stage 1: Example Selection and Operation Conditions Setting

In a certain multi-person collaborative towing operation, there are seven people participating, including a commander A, a trainer B, an anchor operator C and four tugboat drivers D1-D4. The training cases are as follows: the distance between the jacket and the installation position is 1400 m after the jacket slides to be launched. An installation ship provides two anchor cable for main towing. There are other four tugboats for auxiliary towing. The anchor cable provides the main towing force by recovery during towing. The four towropes cooperate to control the jacket course and avoid deviation.

TABLE 1 standing position and main function of each participant

| Person | Standing position in system | Function introduction |
|---|---|---|
| Commander A | Visual simulation subsystem | Issue operation instructions and check collision interference |
| Trainer B | Comprehensive management and evaluation subsystem | Issue training subject and control start-stop of simulation |
| Anchor operator C | Operation control simulation subsystem-anchor console | Retract and release main towrope based on instructions |
| Tugboat driver D1-D4 | Operation control simulation subsystem-tugboat console | Maintain jacket course based on cooperative driving of tugboats |

TABLE 2

| Operation conditions setting | | | | |
| --- | --- | --- | --- | --- |
| Environment condition | Significant wave height | Wave direction | Current direction | Current velocity |
| Unit Numerical value | m 1 | deg 135 | deg 135 | m/s 0.5 |
| Operation conditions | Jacket course | Distance from jacket to target position | Winch speed | Average navigation speed of tugboat |
| Unit Numerical value | deg 315 | m 1472 | m/min 20 | m/s 0.25 |

Stage 2: Determine Task Object and Set Initial Parameters

The marine environment parameters, the physical property parameters of the jacket, the physical property parameters of the tugboat, initial position, heading, position where the towrope is connected on the jacket and tugboat, the physical property parameters of the towropes, and the number of towrope nodes, etc. are set based on the jacket towing scheme and the selected towrope properties.

According to the jacket towing scheme, the example task is divided into five task objects:

Task object 1: participants at each standing position are in place, and the instructor successfully releases the operation sea conditions and the simulation subject information according to the operation scheme.

Task object 2: after the jacket is successfully connected with the towropes, the four tugboats remain on standby, the winch operator retracts the towropes according to the instructions until the instructor confirms that the towropes are tensioned.

Task object 3: each tugboat driver adjusts the heading of the tugboats based on the operation instructions of the instructor and starts towing towards the target position, and during towing, the navigation speed is maintained and the jacket course is controlled cooperatively.

Task object 4: before the jacket reaches the designated installation position, the winch operator stops the retraction of the towropes, and each tugboat adjusts the course to assist the jacket to decelerate.

Task object 5: after the jacket reaches the designated position, the jacket is kept in a stable state, and each operation standing position is released from the standby state, and the training is finished.

Stage 3: Jacket Towing Actual Operation Training

All participants arrive at their respective standing positions for simulation training according to the stated objective of the task.

Firstly, by the commander, the distributed simulation software is started, the operation status of all federal members are checked to ensure smooth communication of all subsystems. The initial simulation parameters are set and the simulation subject is issued to each simulation standing position by the instructor through the comprehensive management and evaluation software. The instructor checks whether the participants are in place and whether the visual simulation software is started normally through standing position monitoring. After the preparation, the simulation instructions are issued by the instructor and the training begins.

The main towrope is retracted by the anchor operators through the winch control software based on the instructions of the commander. The states of the towropes are observed by the commander through the three-dimensional live scene. The instructor monitors the simulation data and confirms that the towropes are tensioned. The tugboat operators successively control the tugboat to turn its bow and start to move the ship through the handle and the operating software according to the instructions. In the process of ship moving, the commander and the instructor observe the motion status and collision interference of each of the operation equipment at their respective positions, and issue operation instructions according to the navigation status of the jacket.

When the jacket is about to reach the designated position, the commander issues the instructions. The winch operator stops retracting the towropes. The drivers of tugboat 1 and tugboat 4 positioned at the top of the jacket slow down to stop the ship. The tugboat 2 and tugboat 3 located at the bottom of the jacket decelerate and adjust the course to assist the jacket to decelerate to the specified position.

During the simulation process, the termination of the simulation includes two situations: first, the training task is carried out smoothly and the jacket is successfully towed to the target position; second, in the training process, the tugboat and the jacket are seriously collided and interfered, or there are a plurality of broken towropes, the towing operation cannot be carried on, and the training task is automatically determined to be terminated.

The present disclosure provides an intelligent simulation system for jacket towing and a modeling method thereof. By adopting a distributed simulation architecture based on High Level Architecture (HLA), the intelligent simulation system for jacket towing is divided into five subsystems, namely distributed collaborative simulation subsystem, comprehensive management and evaluation subsystem, operation control simulation subsystem, visual simulation subsystem and motion simulation subsystem. The distributed collaborative simulation subsystem is configured to provide a communication interface for various federal members. A comprehensive management and control subsystem is configured to issue the training subject and control start-stop of the simulation process. The motion simulation subsystem is configured to receive information, such as the initial state of the jacket, the initial state of the tugboat and property parameters of the towrope sent by the instructor through network, and receive the control instructions from the winch console and the tugboat console. The motion simulation subsystem is further configured to simulate the motion states of the jacket, the tugboat and the towrope in real time, and send the simulation data to the visual simulation subsystem and the comprehensive management and evaluation subsystem for scene roaming and data analysis. Based on the established six-degree-of-freedom motion model, real-time motion states of the jacket, the tugboat and the towrope can be accurately simulated considering dynamic sea conditions during the towing process. Combined with the visual simulation subsystem, collision interferences and operation risk points in the towing process of the jacket can be visually fed back. The present disclosure involves human-computer interaction, which can be used for cooperative training and skill training of offshore towing operators, as well as for simulation rehearsal and scheme verification of jacket towing and installation. The present disclosure can effectively guarantee safety of operators and equipment, reduce risk of offshore operation, improve operation efficiency, and has obvious economic and social benefits.

Various embodiments of the description have been described in a progressive manner, and each of which focuses on the differences from the others and among which the same and similar parts can be referred to each other. Because the system disclosed in the embodiment corresponds to the method disclosed in the embodiment, it is described relatively simply, and the relevant parts can be found in the description of the method.

The previous description of the disclosed embodiments is provided to enable those skilled in the art to make or use the present disclosure. Various modifications to these embodiments will be readily apparent to those skilled in the art, and the generic principles defined herein may be applied to other embodiments without departing from the spirit or scope of the disclosure. Therefore, the present disclosure is not intended to be limited to the embodiments shown herein but is to be accorded the widest scope consistent with the principles and novel features disclosed herein.

What is claimed is:

1. An intelligent simulation system for jacket towing, comprising:
   one or more non-transitory computer readable storage media including:
   a distributed collaborative simulation subsystem, a comprehensive management and evaluation subsystem, an operation control simulation subsystem, a visual simulation subsystem and a motion simulation subsystem; wherein
   the distributed collaborative simulation subsystem is configured to provide a communication interface for each subsystem;
   the comprehensive management and evaluation subsystem is configured to generate and issue a simulation subject;
   the operation control simulation subsystem is configured to generate operation instructions;
   the motion simulation subsystem is configured to receive parameters of the simulation subject and the operation instructions, simulate a motion state of a jacket, a motion state of a tugboat and a motion state of a towrope in real time, and transmit the simulated motion states to the visual simulation subsystem;
   the visual simulation subsystem is configured to perform a three-dimensional display for the real-time simulation of the motion state of the jacket, the motion state of the tugboat and the motion state of the towrope;
   the comprehensive management and evaluation subsystem comprises an instructor console and has a function of comprehensive management and evaluation, and the comprehensive management and evaluation subsystem is configured to set marine environment parameters, an initial position of the jacket, an initial position of the tugboat, and physical property parameters of the towrope, generate and issue a simulation training subject, control start-stop of a simulation process of the system, and record and visually display simulation data generated by the motion simulation subsystem;
   the operation control simulation subsystem comprises a tugboat console and a winch console, the tugboat console is configured to set basic operation parameters of tugboat course and navigation speed, and the winch console is configured to set retraction and release speed of the towrope;
   the motion simulation subsystem comprises a six-degree-of-freedom motion simulation model of the jacket, a six-degree-of-freedom motion simulation model of the tugboat and a motion simulation model of the towrope, the motion simulation subsystem is configured to calculate six-degree-of-freedom motion data of the jacket, six-degree-of-freedom motion data of the tugboat and shape and tension of the towrope in real time by receiving the marine environment parameters of current velocity, current direction and wave direction, the initial position of the tugboat, the initial position of the jacket, and initial parameters of diameter, dry weight and wet weight of the towrope generated by the comprehensive management and evaluation subsystem, and the operation instructions of target course, navigation speed and winch speed generated by the operation control simulation subsystem; and the motion simulation subsystem is further configured to provide the simulation data to the visual simulation subsystem and the comprehensive management and evaluation subsystem;
   in the motion simulation subsystem, force of the towrope on the jacket and force of the towrope on the tugboat are respectively introduced into motion equations of the jacket and the tugboat; an end of the towrope is regarded as fixed to the jacket, and a top of the towrope is regarded as fixed to the tugboat; node speeds and spatial positions of the end of the towrope and the top of the towrope are respectively kept consistent with node speeds and spatial positions of the jacket and the tugboat in a solving process; and the jacket, the tugboat and the towrope are regarded as a whole for coupling solution;
   wherein both the six-degree-of-freedom motion simulation model of the jacket and the six-degree-of-freedom motion simulation model of the tugboat take marine environmental loads and tension force generated by the motion simulation model of the towrope into consideration;
   the six-degree-of-freedom motion simulation model of the jacket is:

$$\vec{F}=\vec{F}_I+\vec{F}_D+\vec{F}_B+\vec{F}_{AM\_M}$$

wherein $\vec{F}_I$ is inertia force; $\vec{F}_D$ is drag force; $\vec{F}_B$ is buoyancy; and $\vec{F}_{AM\_M}$ is added mass force;

the six-degree-of-freedom motion simulation model of the tugboat is:

$$M_s\dot{v}_s+C_s(v_s)v_s+D_s(v_s)v_s+g_s(\eta_s)=\tau_{es}$$

wherein $M_s$ is an inertia matrix of a tugboat system, comprising a ship mass matrix and an added mass matrix; $D_s(v_s)$ is a damping matrix of the tugboat; $g_s(\eta_s)$ is a vector of force and moment caused by gravity and buoyancy; $C_s(v_s)$ is a Coriolis force matrix; and $\tau_{es}$ is thrust on the tugboat;

the motion simulation model of the towrope is:

$$\underbrace{[m_i+a_i]\ddot{r}_i}_{mass+addedmass}=\underbrace{T_{i+(1/2)}-T_{i-(1/2)}+C_{i+(1/2)}-C_{i-(1/2)}}_{internal-stiffness-and-damping}+\underbrace{W_i+B_i}_{weight-and-contact}+\underbrace{D_{p_i}+D_{q_i}}_{drag}$$

wherein $m_i$ is a mass matrix of node i; $a_i$ is an added mass matrix of the node i; T is tension at a node; C is internal damping force of the node; $W_i$ is net buoyancy per unit length; $D_{p_i}$ is lateral damping force at the node; and $D_{q_i}$ is tangential damping force at the node.

2. The intelligent simulation system for jacket towing according to claim 1, wherein the distributed collaborative simulation subsystem adopts a distributed simulation architecture based on High Level Architecture (HLA), and the distributed collaborative simulation subsystem is configured to communicate with each federal member by utilizing a Real Time Interface (RTI) and monitor an operation status of each federal member through a federal operation monitoring module.

3. The intelligent simulation system for jacket towing according to claim 1, wherein the visual simulation subsystem comprises a three-dimensional model library for towing operation of the jacket and a visual simulation software; and
the visual simulation subsystem is configured to drive three-dimensional scene through model simulation data and render the motion state of the jacket, the motion state of the tugboat, the shape of the towrope and a marine environment in real time.

4. An intelligent simulation method for jacket towing, comprising:
executing, by at least one computer processor, a non-transitory computer readable storage medium, the non-transitory computer readable storage medium including executable instructions configured to cause the computer processor to perform the following steps:
step (1): starting, using the at least one computer processor, a distributed collaborative simulation subsystem to enable software and hardware communications of each subsystem and monitor an operation status of each federal member;
step (2): applying, using the at least one computer processor, a comprehensive management and evaluation subsystem to select a simulation training subject, set sea conditions, an initial position of a jacket, an initial position of a tugboat and initial parameters of a towrope, send the set parameters to a motion simulation subsystem and control start-stop of a simulation process of the system through network;
step (3): applying, using the at least one computer processor, an operation control simulation subsystem to set winch speed and tugboat control instructions through an operation handle and a control software according to simulation requirements, and send the winch speed and the tugboat control instructions to the motion simulation subsystem;
step (4): applying, using the at least one computer processor, the motion simulation subsystem comprising a six-degree-of-freedom motion simulation model of the jacket, a six-degree-of-freedom motion simulation model of the tugboat and a motion simulation model of the towrope to drive the six-degree-of-freedom motion simulation model based on the control instructions sent by the comprehensive management and evaluation subsystem and the operation control simulation subsystem, calculate a motion state of a coupling system in real time, and transmit simulation data to the comprehensive management and evaluation subsystem and a visual simulation subsystem; and
step (5): applying, using the at least one computer processor, the visual simulation subsystem to render training scene and operation equipment in real time and display the training scene and the three-dimensional operation equipment, based on marine environment data issued by the comprehensive management and evaluation subsystem and the simulation data calculated by the motion simulation subsystem;
wherein in step (4), force of the towrope on the jacket and force of the towrope on the tugboat are respectively introduced into motion equations of the jacket and the tugboat; an end of the towrope is regarded as fixed to the jacket, and a top of the towrope is regarded as fixed to the tugboat; node speeds and spatial positions of the end of the towrope and the top of the towrope are respectively kept consistent with node speeds and spatial positions of the jacket and the tugboat in a solving process, and the jacket, the tugboat and the towrope are regarded as a whole for coupling solution;
both the six-degree-of-freedom motion simulation model of the jacket and the six-degree-of-freedom motion simulation model of the tugboat take marine environmental loads and tension force generated by the motion simulation model of the towrope into consideration;
in step (4), the six-degree-of-freedom motion simulation model of the jacket is:

$$\vec{F}=\vec{F}_I+\vec{F}_D+\vec{F}_B+\vec{F}_{AM\_M}$$

wherein $\vec{F}_I$ is inertia force, $\vec{F}_D$ is drag force, $\vec{F}_B$ is buoyancy, and $\vec{F}_{AM\_M}$ is added mass force;
the six-degree-of-freedom motion simulation model of the tugboat is:

$$M_s\dot{v}_s+C_s(v_s)v_s+D_s(v_s)v_s+g_s(\eta_s)=\tau_{es}$$

wherein $M_s$ is an inertia matrix of a tugboat system, comprising a ship mass matrix and an added mass matrix, $D_s(v_s)$ is a damping matrix of the tugboat, $g_s(\eta_s)$ is a vector of force and moment caused by gravity and buoyancy, $C_s(v_s)$ is a Coriolis force matrix, and $\tau_{es}$ is thrust on the tugboat;
the motion simulation model of the towrope is:

$$\underbrace{[m_i+a_i]}_{mass+addedmass}\ddot{r}_i = \underbrace{T_{i+(1/2)}-T_{i-(1/2)}+C_{i+(1/2)}-C_{i-(1/2)}}_{internal-stiffness-and-damping}+\underbrace{W_i+B_i}_{weight-and-contact}+\underbrace{D_{p_i}+D_{q_i}}_{drag}$$

wherein $m_i$ is a mass matrix of node i, $a_i$ is an added mass matrix of the node i, T is tension at a node, C is internal damping force of the node, $W_i$ is net buoyancy per unit length, $D_{p_i}$ is lateral damping force at the node, and $D_{q_i}$ is tangential damping force at the node.

5. The intelligent simulation method for jacket towing according to claim 4, wherein in step (4), the motion simulation model of the towrope calculates based on the initial parameters of the towrope set by the comprehensive management and evaluation subsystem.

* * * * *